US010033085B2

(12) United States Patent
Lin et al.

(10) Patent No.: US 10,033,085 B2
(45) Date of Patent: Jul. 24, 2018

(54) ACOUSTIC-WAVE DEVICE WITH ACTIVE CALIBRATION MECHANISM

(71) Applicant: Airoha Technology Corp., Hsinchu (TW)

(72) Inventors: Heng-Chih Lin, Hsinchu (TW); Chin-Lung Yang, Taoyuan (TW)

(73) Assignee: AIROHA TECHNOLOGY CORP., Hsinchu (TW)

( * ) Notice: Subject to any disclaimer, the term of this patent is extended or adjusted under 35 U.S.C. 154(b) by 10 days.

(21) Appl. No.: 15/456,680

(22) Filed: Mar. 13, 2017

(65) Prior Publication Data
US 2017/0271743 A1 Sep. 21, 2017

(30) Foreign Application Priority Data

Mar. 15, 2016 (TW) .............................. 105107942 A
Mar. 15, 2016 (TW) .............................. 105107944 A

(51) Int. Cl.
| | |
|---|---|
| H03H 9/72 | (2006.01) |
| H03L 7/04 | (2006.01) |
| H03D 3/08 | (2006.01) |
| H04B 1/44 | (2006.01) |
| H01P 7/08 | (2006.01) |
| H03B 5/32 | (2006.01) |
| H03H 9/64 | (2006.01) |
| H03L 7/093 | (2006.01) |
| H03L 7/099 | (2006.01) |
| H03J 3/00 | (2006.01) |

(52) U.S. Cl.
CPC ............. *H01P 7/088* (2013.01); *H03B 5/326* (2013.01); *H03H 9/64* (2013.01); *H03H 9/6403* (2013.01); *H03H 9/6483* (2013.01); *H03H 9/725* (2013.01); *H03J 3/00* (2013.01); *H03L 7/093* (2013.01); *H03L 7/099* (2013.01); *H03H 2210/012* (2013.01); *H03H 2210/04* (2013.01)

(58) Field of Classification Search
CPC . H03H 9/725; H03L 7/04; H03D 3/08; H04B 1/44
USPC ................ 333/133; 331/9, 32; 455/214, 263
See application file for complete search history.

(56) References Cited

U.S. PATENT DOCUMENTS

| | | | |
|---|---|---|---|
| 7,221,920 B2 * | 5/2007 | Abe ...................... | H03B 5/326 331/108 B |
| 8,011,074 B2 | 9/2011 | Bhattacharjee et al. | |

(Continued)

*Primary Examiner* — Dean Takaoka
(74) *Attorney, Agent, or Firm* — McClure, Qualey & Rodack, LLP

(57) ABSTRACT

An acoustic-wave device with active calibration mechanism is provided. The acoustic-wave device with active calibration mechanism includes at least one adjustable acoustic-wave duplexer, a frequency discriminator and a control circuit. The adjustable acoustic-wave duplexer has a first terminal point, a second terminal point and a third terminal point. The adjustable acoustic-wave duplexer includes a TX filter, an RX filter, a first loop switch and a second loop switch. The first loop switch is used for conducting a first loop. The second loop switch is used for conducting a second loop. The control circuit adjusts the operating frequency of the TX filter according to a first loop calibration signal. The control circuit adjusts the operating frequency of the operating frequency of the RX filter according to the second loop calibration signal.

10 Claims, 6 Drawing Sheets

(56) References Cited

U.S. PATENT DOCUMENTS

| | | | |
|---|---|---|---|
| 8,346,180 B2* | 1/2013 | Kamizuma | H04B 1/0082 455/73 |
| 2010/0212127 A1* | 8/2010 | Heinze | H03H 3/04 29/25.35 |
| 2011/0018649 A1* | 1/2011 | David | H03B 5/326 331/158 |
| 2013/0039228 A1 | 2/2013 | Caron | |
| 2013/0234806 A1* | 9/2013 | Schmidhammer | H01P 1/213 333/133 |
| 2014/0220921 A1* | 8/2014 | Mo | H04L 27/38 455/266 |
| 2015/0341016 A1* | 11/2015 | Iwaki | H03H 9/205 333/133 |
| 2017/0272056 A1* | 9/2017 | Lin | H01P 7/088 |

* cited by examiner

ACOUSTIC-WAVE DEVICE WITH ACTIVE CALIBRATION MECHANISM

This application claims the benefits of Taiwan application Serial No. 105107942, filed Mar. 15, 2016 and Taiwan application Serial No. 105107944, filed Mar. 15, 2016, the subject matters of which are incorporated herein by reference.

BACKGROUND OF THE INVENTION

Field of the Invention

The invention relates in general to an acoustic-wave device, and more particularly to an acoustic-wave device with active calibration mechanism.

Description of the Related Art

Referring to FIG. 1, a schematic diagram of an acoustic-wave device 900 is shown. The acoustic-wave device 900 includes a piezoelectric substrate 910, a piezo film layer 920 and an interdigitated capacitor structure 930. Surface acoustic waves are spread on the interdigitated capacitor structure 930. An electric signal is converted into an acoustic signal by the piezo film layer 920, then the acoustic signal is further converted into an electric signal.

Along with the development of the technique of surface acoustic wave, the acoustic-wave device 900 has been used in many fields. For example, the acoustic-wave device 900 can be used as a filter, an oscillator, a transformer and a sensor of a mobile phone. The acoustic-wave device 900 can also be used in the fields of radio and TV, such that the frequency range of radio reception can be very narrow and accurate. Or, the acoustic-wave device 900 can monitor and forecast earthquakes because the surface acoustic wave can be spread on the surface of the earth.

Since the interdigitated capacitor structure 930 and the piezo film layer 920 have different coefficients of thermal expansion, the acoustic-wave device 900 may generate warpage. Referring to FIG. 2A, a schematic diagram of the acoustic-wave device 900 at a low temperature state is shown. When the acoustic-wave device 900 at the low temperature state, the contraction of the interdigitated capacitor structure 930 is greater than that of the piezo film layer 920, so the two edges of the acoustic-wave device 900 will be warped upward. At the low temperature state, the pitch of the interdigitated capacitor structure 930 is reduced, the signals are shifted towards high frequencies.

Referring to FIG. 2B, a schematic diagram of the acoustic-wave device 900 at a high temperature state is shown. When the acoustic-wave device 900 at the high temperature state, the expansion of the interdigitated capacitor structure 930 is greater than that of the piezo film layer 920, so the two edges of the acoustic-wave device 900 will be warped downward. At the high temperature state, the pitch of the interdigitated capacitor structure 930 is enlarged, the signals are shifted towards low frequencies.

Referring to FIG. 3A, an insertion loss curve diagram of the acoustic-wave device 900 under different temperatures is shown. The frequency response curve L11 is an insertion loss curve measured at 20° C., the frequency response curve L12 is an insertion loss curve measured at 50° C., and the frequency response curve L13 is an insertion loss curve measured at 85° C. The three frequency response curves L11, L12 and L13 show that as the temperature increases, the insertion loss gradually drifts towards low frequencies.

Referring to FIG. 3B, a return loss curve diagram of the acoustic-wave device 900 under different temperatures. The frequency response curve L21 is a return loss curve measured at 20° C., the frequency response curve L22 is a return loss curve measured at 50° C., and the frequency response curve L23 is a return loss curve measured at 85° C. The three frequency response curves L21, L22 and L23 show that as the temperature increases, the return loss gradually drifts towards low frequencies.

Apart from the temperature which may cause signal variation to the acoustic-wave device 900, errors in the manufacturing process also cause signal variation to the acoustic-wave device 900. For example, when the pitch of the interdigitated capacitor structure 930 is too small, signals will shift towards high frequencies. On the other hand, when the pitch of the interdigitated capacitor structure 930 is too large, signals will shift towards low frequencies.

As disclosed above, signal variation caused by temperature factor or manufacturing process factor has always been a bottleneck that is hard to overcome. The research personnel in the industries have been dedicated to resolve the bottleneck.

SUMMARY OF THE INVENTION

The invention is directed to an acoustic-wave device with active calibration mechanism. An adjustable acoustic-wave duplexer is analyzed to understand a signal variation caused from temperature factor or manufacturing process factor, such that the acoustic-wave device can be actively calibrated.

According to an embodiment of the present invention, an acoustic-wave device with active calibration mechanism is provided. The acoustic-wave device with active calibration mechanism includes at least one adjustable acoustic-wave duplexer, a frequency discriminator and a control circuit. The adjustable acoustic-wave duplexer has a first terminal point, a second terminal point and a third terminal point. The adjustable acoustic-wave duplexer includes a TX filter, an RX filter, a first loop switch and a second loop switch. The TX filter is electrically connected between the first terminal point and the second terminal point. The RX filter is electrically connected between the first terminal point and the third terminal point. The first loop switch is electrically connected between the first terminal point and the third terminal point. The first loop switch is used for conducting a first loop formed by the second terminal point, the TX filter, the first terminal point and the third terminal point sequentially. The second loop switch is electrically connected between the first terminal point and the second terminal point. The second loop switch is used for conducting a second loop formed by the second terminal point, the first terminal point, the RX filter and the third terminal point sequentially. The frequency discriminator is connected to the adjustable acoustic-wave duplexer. The control circuit is connected to the adjustable acoustic-wave duplexer and the frequency discriminator. The frequency discriminator inputs a first loop test signal and receives a first loop feedback signal through the first loop to generate a first loop calibration signal according to the first loop test signal and a first frequency deviation of the first loop feedback signal. The control circuit further adjusts the operating frequency of the TX filter according to the first loop calibration signal. The frequency discriminator inputs a second loop test signal and receives a second loop feedback signal through the second loop to generate a second loop calibration signal according to the second loop test signal and a second frequency deviation of the second loop feedback signal. The control circuit further adjusts the operating frequency of the operating frequency of the RX filter according to the second loop calibration signal.

According to another embodiment of the present invention, an acoustic-wave device with active calibration mechanism is provided. The acoustic-wave device with active calibration mechanism includes at least one adjustable acoustic-wave duplexer, a phase-locked loop (PLL) and a control circuit. The adjustable acoustic-wave duplexer includes a TX filter and an RX filter. The phase-locked loop includes a voltage-controlled oscillation (VCO). The voltage-controlled oscillation includes a calibration resonator. The TX filter, the RX filter and the calibration resonator are disposed on the same piezoelectric substrate. The phase-locked loop generates a loop calibration signal according to a frequency deviation of the calibration resonator. The control circuit is connected to the adjustable acoustic-wave duplexer and the phase-locked loop. The control circuit further adjusts the operating frequency of the TX filter or the operating frequency of the RX filter according to the loop calibration signal.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
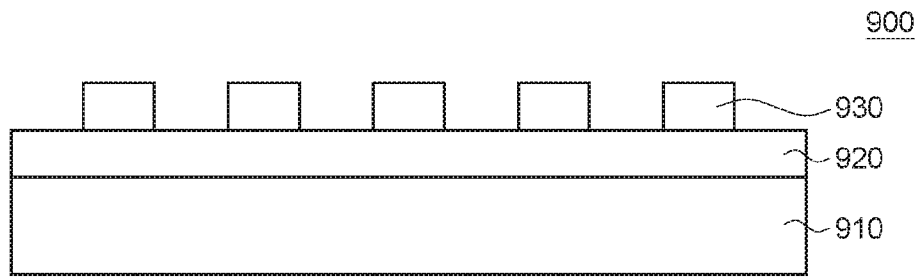
FIG. 1 (prior art) shows a schematic diagram of an acoustic-wave device.
Figure 2A:
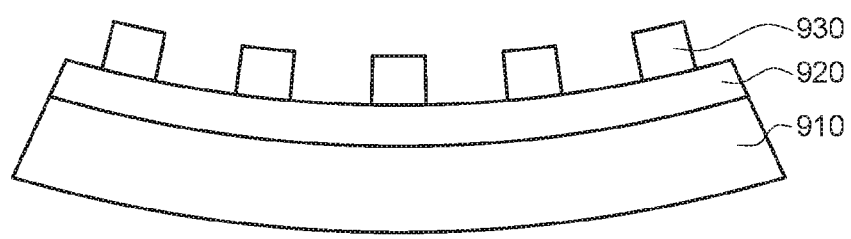
FIG. 2A (prior art) shows a schematic diagram of the acoustic-wave device at a low temperature state.
Figure 2B:
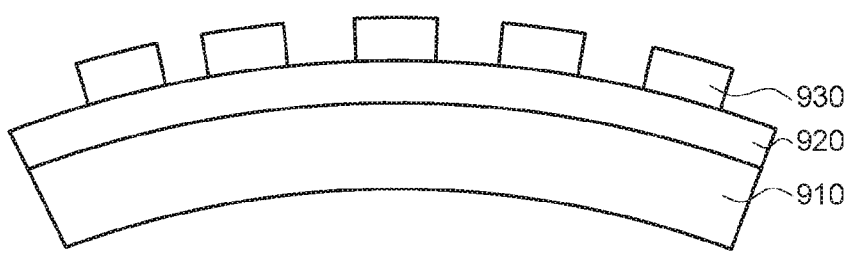
FIG. 2B (prior art) shows a schematic diagram of the acoustic-wave device at a high temperature state.
Figure 3A:
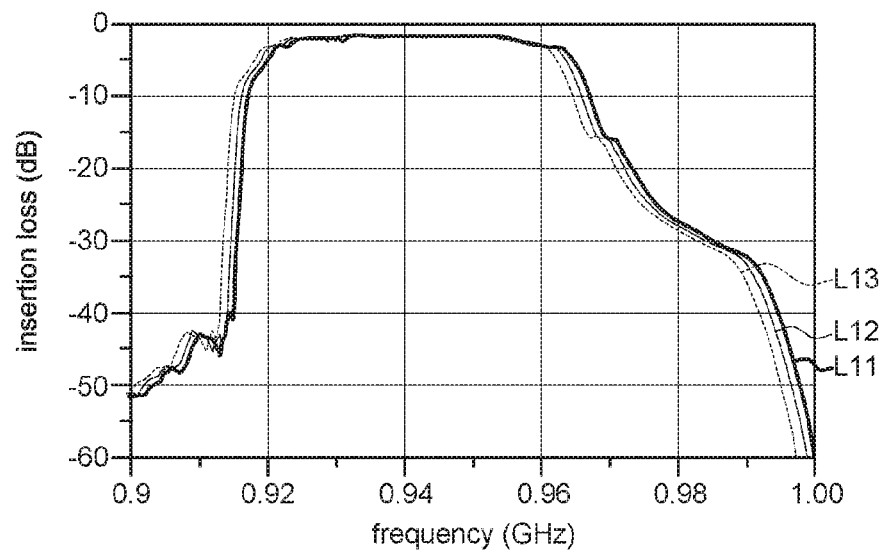
FIG. 3A (prior art) shows an insertion loss curve diagram of the acoustic-wave device under different temperatures.
Figure 3B:
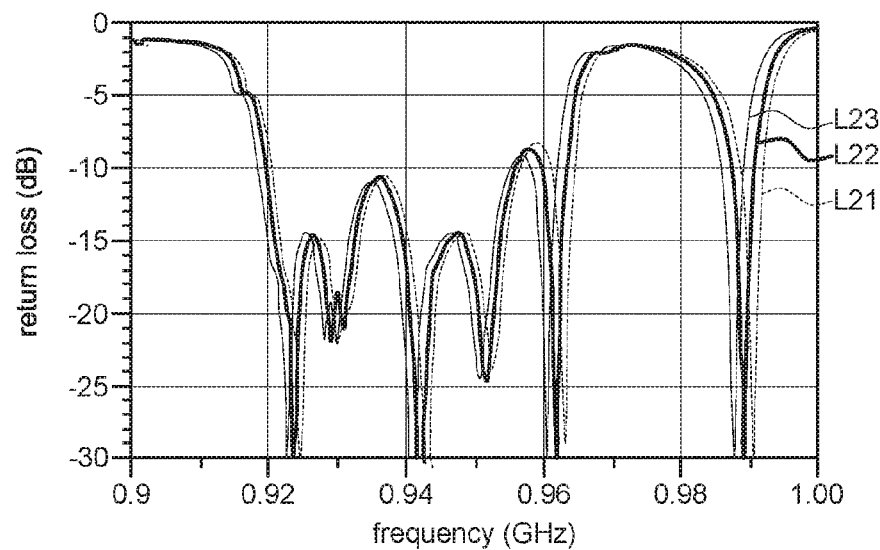
FIG. 3B (prior art) shows a return loss curve diagram of the acoustic-wave device under different temperatures.
Figure 4:
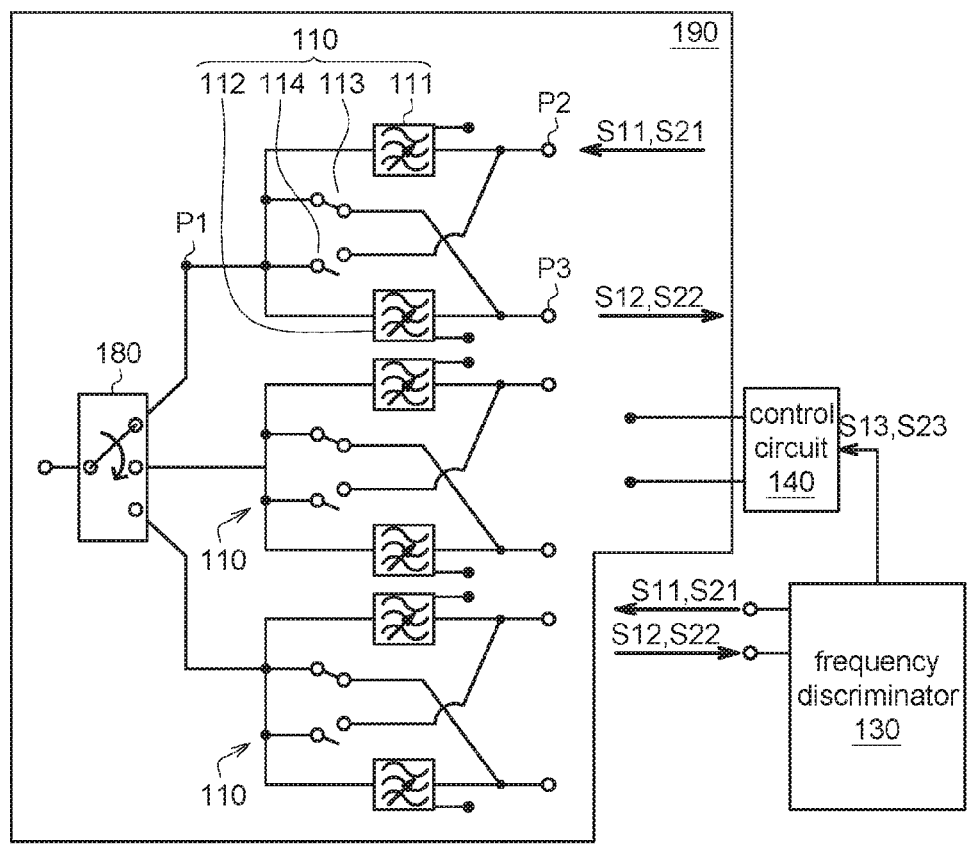
FIG. 4 shows a schematic diagram of an acoustic-wave device with active calibration mechanism according to an embodiment of the invention.

Referring to FIG. 4, a schematic diagram of an acoustic-wave device 100 with active calibration mechanism according to an embodiment of the invention is shown. The acoustic-wave device 100 includes at least one adjustable acoustic-wave duplexer 110, a frequency discriminator 130, a control circuit 140 and a piezoelectric substrate 190. The adjustable acoustic-wave duplexer 110 includes a TX filter 111, an RX filter 112, a first loop switch 113 and a second loop switch 114. The TX filter 111 is used for transmitting signals. The RX filter 1122 is used for receiving signals. In one embodiment, the acoustic-wave device 100 may includes multiple adjustable acoustic-wave duplexers 110 for processing the signals of different frequency bands. The multiple adjustable acoustic-wave duplexers 110 can be switched using a switch 180.

Figure 5:
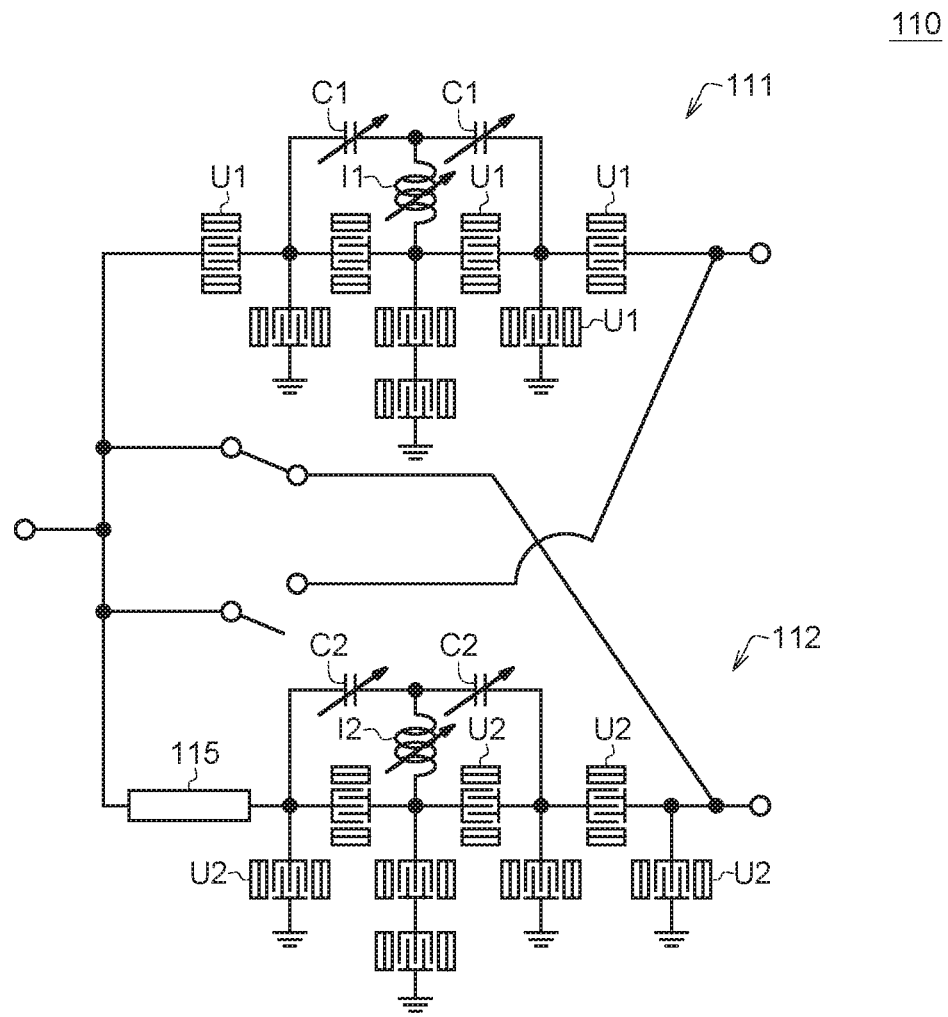
FIG. 5 shows a schematic diagram of an adjustable acoustic-wave duplexer.

Referring to FIG. 5, a schematic diagram of the adjustable acoustic-wave duplexer 110 is shown. The RX filter 112 is connected to a phase shifter 115. The TX filter 111 includes a plurality of transmitting resonators U1, two variable capacitors C1 and a variable inductor I1. The RX filter 112 includes a plurality of receiving resonators U2, two variable capacitors C2 and a variable inductor I2. Each of the transmitting resonator U1 and the receiving resonator U2 is an interdigitated structure whose pitch may be easily changed due to temperature factor or manufacturing process factor.

Figure 6A:
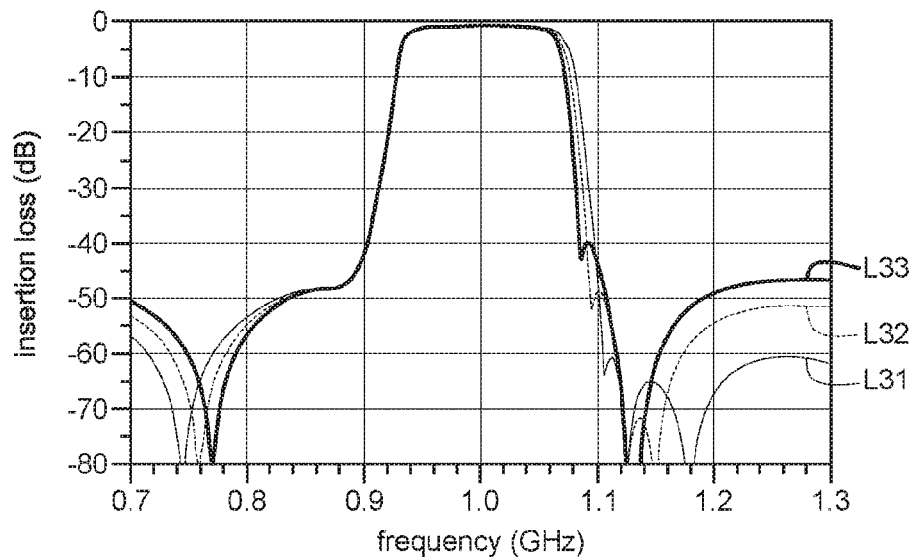
FIG. 6A shows an insertion loss curve diagram of a variable capacitor set at different capacitances.

Referring to FIG. 6A, an insertion loss curve diagram of the variable capacitor C1 set at different capacitances is shown. Let the TX filter 111 be taken. Given that the variable inductor I1 is fixed at 1.5 nH, the frequency response curve L31 is an insertion loss curve obtained when the variable capacitor C1 is set as 0.25 pF; the frequency response curve L32 is an insertion loss curve obtained when the variable capacitor C1 is set as 0.40 pF; the frequency response curve L33 is an insertion loss curve obtained when the variable capacitor C1 is set as 0.55 pF. The three frequency response curves L31, L32 and L33 show that the operating frequency of the TX filter 111 can be changed through the control of the variable capacitor C1. Similarly, the operating frequency of the RX filter 112 can also be changed through the control of the variable capacitor C2. Thus, as indicated in FIG. 4, the control circuit 140 can control the variable capacitor C1 or the variable capacitor C2 to adjust the operating frequency of the TX filter 111 or the operating frequency of the RX filter 112.

Figure 6B:
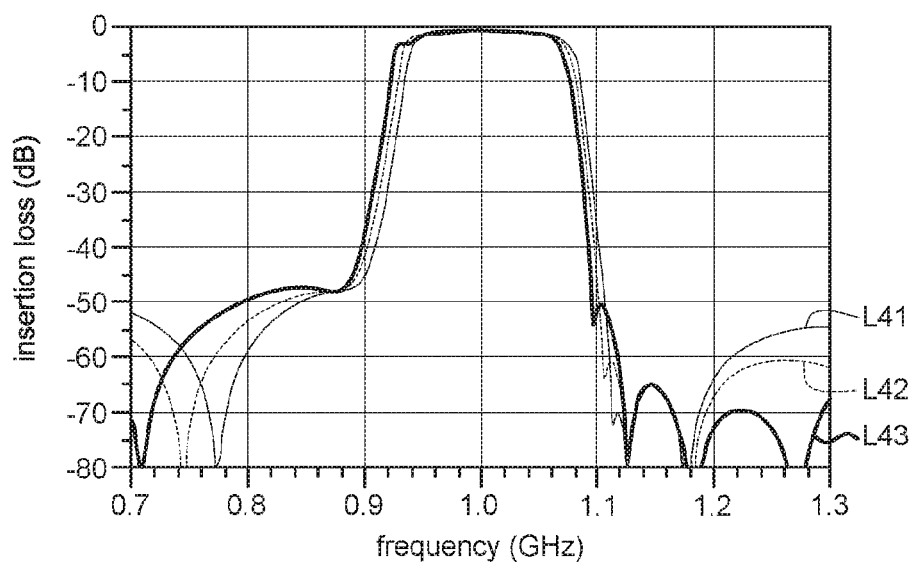
FIG. 6B shows an insertion loss curve diagram of a variable inductor set at different inductances.

Referring to FIG. 6B, an insertion loss curve diagram of the variable inductor I1 set at different inductances is shown. Let the TX filter 111 be taken for example. Given that the variable capacitor C1 is fixed at 0.25 pF, Given that the variable capacitor C1 is fixed at 0.25 pF, the frequency response curve L41 is an insertion loss curve obtained when the variable inductor I1 is set as 0.5 nH; the frequency response curve L42 is an insertion loss curve obtained when the variable inductor I1 is set as 1.5 nH; the frequency response curve L43 is an insertion loss curve obtained when the variable inductor I1 is set as 2.5 nH. The three frequency response curves L41, L42, and L43 show that the operating frequency of the TX filter 111 can be changed through the control of the variable inductor I1. Similarly, the operating frequency of the RX filter 112 can also be changed through the control of the variable inductor I2. Thus, as indicated in FIG. 4, the control circuit 140 can control the variable inductor I1 or the variable inductor I2 to adjust the operating frequency of the TX filter 111 or the operating frequency of the RX filter 112.

Figure 7A:
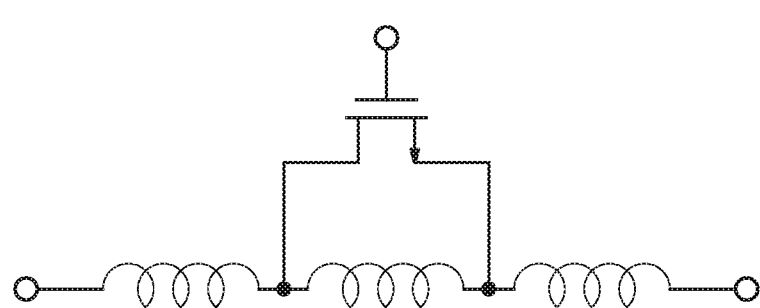
FIGS. 7A to 7C show schematic diagrams of different designs of the variable inductor.
Figure 7B:
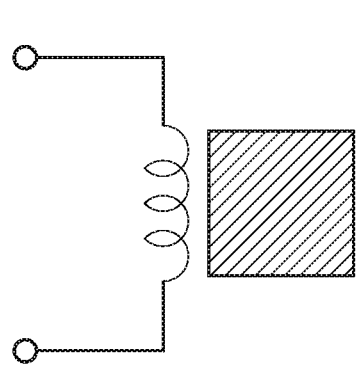
Figure 7C:
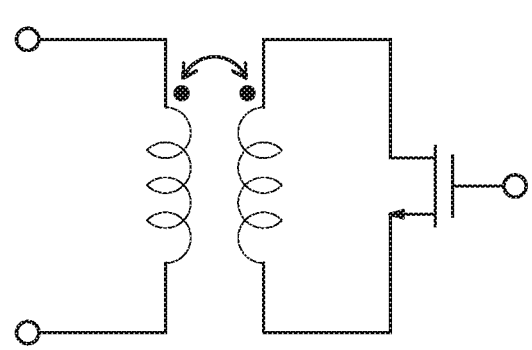

Referring to FIGS. 7A to 7C, schematic diagrams of different designs of the variable inductors I1 and I2 are shown. In various embodiments, the variable inductors I1 and I2 can adopt different designs. As indicated in FIG. 7A, the variable inductors I1 and I2 can respectively be realized by a switch-type inductor Ia. As indicated in FIG. 7B, the variable inductors I1 and I2 can respectively be realized by an MEMS-type inductor Ib. As indicated in FIG. 70, the variable inductors I1 and I2 can respectively be realized by a transformer-type inductor Ic.

Refer to FIG. 4. The TX filter 111 is electrically connected between the first terminal point P1 and the second terminal point P2. The RX filter 112 is electrically connected between the first terminal point P1 and the third terminal point P3.

The first loop switch 113 is electrically connected between the first terminal point P1 and the third terminal point P3. The first loop switch 113 is used for conducting a first loop formed by the second terminal point P2, the TX filter 111, the first terminal point P1 and the third terminal point P3 sequentially. The second loop switch 114 is electrically connected between the first terminal point P1 and the second terminal point P2. The second loop switch 114 is used for conducting a second loop formed by the second terminal point P2, the first terminal point P1, the RX filter 112 and the third terminal point P3 sequentially. Through the control of the first loop switch 113 and the second loop switch 114, the first loop and the second loop are connected at different times.

The frequency discriminator 130 is connected to the adjustable acoustic-wave duplexer 110. The control circuit 140 is connected to the adjustable acoustic-wave duplexer 110 and the frequency discriminator 130. The frequency discriminator 130 inputs a first loop test signal S11 and receives a first loop feedback signal S12 through the first loop to generate a first loop calibration signal S13 according to the first loop test signal S11 and a first frequency deviation of the first loop feedback signal S12. The control circuit 140 further digitally adjusts the operating frequency of the TX filter 111 according to the first loop calibration signal S13.

The frequency discriminator 130 inputs a second loop test signal S21 and receives a second loop feedback signal S22 through the second loop to generate a second loop calibration signal S23 according to the second loop test signal S21 and a second frequency deviation of the second loop feedback signal S22. The control circuit 140 further digitally adjusts the operating frequency of the RX filter 112 according to the second loop calibration signal S23. After the operating frequency of the TX filter 111 and the operating frequency of the RX filter 112 are adjusted, the first loop switch 113 and the second loop switch 114 both are in an open state so that the performance of the adjustable acoustic-wave duplexer 110 will not be affected.

As disclosed above, the control circuit 140 can adjust the operating frequency of the TX filter 111 or the operating frequency of the RX filter 112 using the variable capacitors C1 and C2 or the variable inductors I1 and I2.

According to the above embodiments, in the acoustic-wave device 100 with active calibration mechanism, the TX filter 111 or the RX filter 112 is analyzed to understand a signal variation of the transmitting resonator U1 or the receiving resonator U2 caused from temperature factor or manufacturing process factor, such that the acoustic-wave device 100 can be actively calibrated.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An acoustic-wave device with active calibration mechanism, comprising:
    at least one adjustable acoustic-wave duplexer having a first terminal point, a second terminal point and a third terminal point, wherein the adjustable acoustic-wave duplexer comprises:
        a TX filter electrically connected between the first terminal point and the second terminal point;
        an RX filter electrically connected between the first terminal point and the third terminal point;
        a first loop switch electrically connected between the first terminal point and the third terminal point for conducting a first loop formed by the second terminal point, the TX filter, the first terminal point and the third terminal point sequentially; and
        a second loop switch electrically connected between the first terminal point and the second terminal point for conducting a second loop formed by the second terminal point, the first terminal point, the RX filter and the third terminal point sequentially;
    a frequency discriminator connected to the adjustable acoustic-wave duplexer; and
    a control circuit connected to the adjustable acoustic-wave duplexer and the frequency discriminator;
    wherein the frequency discriminator inputs a first loop test signal and receives a first loop feedback signal through the first loop to generate a first loop calibration signal according to the first loop test signal and a first frequency deviation of the first loop feedback signal, and the control circuit further adjusts the operating frequency of the TX filter according to the first loop calibration signal;
    the frequency discriminator inputs a second loop test signal and receives a second loop feedback signal through the second loop to generate a second loop calibration signal according to the second loop test signal and a second frequency deviation of the second loop feedback signal, and the control circuit further adjusts the operating frequency of the RX filter according to the second loop calibration signal.

2. The acoustic-wave device with active calibration mechanism according to claim 1, wherein the control circuit digitally adjusts the operating frequency of the TX filter and the RX filter.

3. The acoustic-wave device with active calibration mechanism according to claim 1, wherein the TX filter comprises at least one variable capacitor, and the control circuit controls the variable capacitor to adjust the operating frequency of the TX filter.

4. The acoustic-wave device with active calibration mechanism according to claim 1, wherein the TX filter comprises at least one variable inductor, and the control circuit controls the variable inductor to adjust the operating frequency of the TX filter.

5. The acoustic-wave device with active calibration mechanism according to claim 4, wherein the variable inductor is a switch-type inductor, an MEMS-type inductor or a transformer-type inductor.

6. The acoustic-wave device with active calibration mechanism according to claim 1, wherein the RX filter comprises at least one variable capacitor, and the control circuit controls the variable capacitor to adjust the operating frequency of the TX filter.

7. The acoustic-wave device with active calibration mechanism according to claim 1, wherein the RX filter comprises at least one variable inductor, and the control circuit controls the variable inductor to adjust the operating frequency of the TX filter.

8. The acoustic-wave device with active calibration mechanism according to claim 7, wherein the variable inductor is a switch-type inductor, an MEMS-type inductor or a transformer-type inductor.

9. The acoustic-wave device with active calibration mechanism according to claim 1, wherein after the operating frequency of the TX filter and the operating frequency of the RX filter are adjusted, the first loop switch and the second loop switch both are in an open state.

10. The acoustic-wave device with active calibration mechanism according to claim 1, wherein the TX filter and the RX filter are disposed on the same piezoelectric substrate.

\* \* \* \* \*